United States Patent [19]

Chen

[11] Patent Number: 5,008,212

[45] Date of Patent: Apr. 16, 1991

[54] SELECTIVE ASPERITY DEFINITION TECHNIQUE SUITABLE FOR USE IN FABRICATING FLOATING-GATE TRANSISTOR

[76] Inventor: Teh-yi J. Chen, 22409 St. Andrews Ave., Cupertino, Calif. 95014

[21] Appl. No.: 283,340

[22] Filed: Dec. 12, 1988

[51] Int. Cl.⁵ .................. H01L 21/265; H01L 21/70
[52] U.S. Cl. ........................... 437/43; 437/52;
   437/195; 437/193; 437/228; 437/233
[58] Field of Search ............... 437/43, 47, 52, 46,
   437/228; 357/23.6, 23.5

[56] References Cited

U.S. PATENT DOCUMENTS

| | | | |
|---|---|---|---|
| 4,119,995 | 10/1978 | Simko | 357/23 |
| 4,566,175 | 1/1986 | Smaylin et al. | 437/43 |
| 4,763,299 | 8/1988 | Hazani | 365/189 |
| 4,764,479 | 8/1986 | Kosa et al. | 437/52 |
| 4,853,895 | 8/1989 | Mitchel et al. | 437/43 |

FOREIGN PATENT DOCUMENTS

0210809 2/1987 European Pat. Off. ........... 457/23.5

Primary Examiner—Brian E. Hearn
Assistant Examiner—T. Thomas

[57] ABSTRACT

In a semiconductor fabrication technique, a first patterned layer (16) of nonmonocrystalline semiconductor material is created on a substructure (10, 12, and 14). An insulating layer (22) is thermally grown along the patterned layer in such a way that the upper edge of the remainder (16A) of the patterned layer forms an asperity (24). A blanket layer 26, preferably consisting of nonmonocrystalline semiconductor material, is formed over the insulating layer. Using an etchant that attacks the blanket and patterned layers more than the insulating layer, a selective etch is performed to remove a section of the blanket layer. The etch is continued past the blanket layer to remove the underlying portion of the insulating layer located along the asperity and then, importantly, to remove the so exposed part of the asperity. The remainder (26A) of the blanket overlies the remainder (24A) of the asperity. The technique is particularly useful in manufacturing a floating-gate FET for an electrically erasable programmable device. The remainder of the asperity facilitates tunneling during erasure.

20 Claims, 7 Drawing Sheets

Fig. 9a
PROGRAM

Fig. 9b
ERASE

Fig. 9c
READ

SELECTIVE ASPERITY DEFINITION TECHNIQUE SUITABLE FOR USE IN FABRICATING FLOATING-GATE TRANSISTOR

FIELD OF USE

This invention relates generally to semiconductor processing technology. More particularly, this invention relates to techniques useful in manufacturing a floating-gate field-effect transistor ("FET") for a programmable element of an electrically alterable integrated circuit such as an electrically erasable programmable read-only memory ("EEPROM"), an electrically erasable programmable logic device ("EEPLD"), or another device having electrically erasable programmable circuitry.

BACKGROUND ART

An EEPROM is a semiconductor device that contains a group of memory cells for storing an electrically alterable pattern of binary information in a non-volatile manner. Each EEPROM cell typically centers around an MOS-type FET having a floating gate and one or more control gates. The floating gate is fully surrounded by electrically insulating material.

Using mechanisms such as hot carrier injection and electron energy-barrier tunneling, various levels of electronic charge can be placed on the floating gate. Due to the surrounding insulation, the charge stays on the floating gate for long periods of time. This enables the threshold voltage of the FET to be adjusted in a semi-permanent way.

Directly after fabrication, there is substantially no charge on the floating gate. Starting from this virgin state, the cell is "programmed" to one binary value by supplying the floating gate with a high level of charge of a given polarity. The cell is "erased" to the opposite binary value by removing a large amount, preferably all, of the charge from the floating gate. Charge of opposite polarity may even be placed on the floating gate to overerase the cell. In any case, the cell can now be alternately programmed and erased by adjusting the charge on the floating gate in the preceding way.

The charge states for programming and erasure establish two materially different levels for the threshold voltage. To read the stored information, a voltage that lies between the two threshold levels is suitably applied to the cell. The floating-gate FET is then either capable of conducting current or incapable of doing so depending respectively on whether the floating gate is at the erased or programmed condition. This indicates which binary value is stored in the cell.

Numerous types of structures have been developed for floating-gate EEPROM cells. The simplest structures use a single control gate to accomplish the read, program, and erase operations. In more advanced structures, programming and reading are performed with a main control gate commonly referred to simply as the control gate. Erasure is done with a separate control gate generally termed the erase gate. Both control gates lie at least partially over the floating gate. This "double-control-gate" arrangement helps to improve charge retention and EEPROM lifetime. The erase voltage may also be reduced.

In U.S. Pat. No. 4,119,995, Simko describes such a double-control-gate EEPROM cell. Simko's floating-gate FET is an n-channel device. During erasure, electrons tunnel from the floating gate to the erase gate. The tunneling is facilitated by providing the upper surface of the floating gate with sharp protuberances. These "asperities" enhance the electric field along the upper surface of the floating gate so as to reduce the necessary erase voltage. Simko discloses that (at least part of) the upper lateral edge of his floating gate is in the form of a cusp-shaped asperity.

Hazani, U.S. Pat. No. 4,763,229, describes another n-channel double-control-gate EEPROM cell in which asperities lie along the upper surface of the portion of the floating gate located below the erase gate but not along the upper surface of the remainder of the floating gate. Consequently, the upper surface of the portion of the floating gate separated from the control gate only by insulating material does not have any asperities. This floating-gate structure is advantageous because it improves tunneling during erasure while minimizing the possibility of undesired tunneling at other times.

In Hazani's fabrication process, recessed field-oxide regions are formed along part of the upper surface of a p-type monocrystalline silicon ("monosilicon") substrate. N-type source and drain zones for the FET are then created in the substrate along its upper surface. A thin gate dielectric layer which adjoins the field oxide is formed along the upper surface of the substrate. A patterned electrically conductive first polycrystalline silicon ("polysilicon") layer that eventually serves as the floating gate is provided over the gate dielectric and over an adjoining section of the field oxide.

Hazani subsequently performs a wet oxidation to grow a main silicon layer along the upper and lateral surfaces of the first polysilicon layer. The oxidation is done in such a way that asperities are produced along the upper surface of the remaining first polysilicon. A patterned electrically conductive second polysilicon layer, part of which later becomes the erase gate, is formed on a portion of the main oxide layer located above the field oxide.

The portion of the main oxide layer not covered by the second polysilicon layer is removed with an etchant that attacks silicon dioxide much more than polysilicon. In this way, the second polysilicon largely prevents asperities on the underlying portion of the first polysilicon from being etched. At this point, Hazani says that he ion implants phosphorus or arsenic to planarize the upper surface of the exposed portion of the first polysilicon and to remove the asperities located on that part of the first polysilicon.

Next, Hazani performs an oxidation to grow a further silicon dioxide layer along the upper surface of the structure. The remainder of the first polysilicon forms the floating gate. The portion of the remaining second polysilicon located above the floating gate is the erase gate.

A patterned third polysilicon layer is provided on the further oxide layer. The third polysilicon layer lies above the floating gate and extends laterally beyond at over a select portion of Hazani's FET. Part of the third polysilicon serves as the control gate. Conventional processing is then employed to complete cell fabrication.

Hazani's EEPROM cell structure offers excellent charge transfer and retention capabilities at relatively low erase voltage. However, it is not clear that the asperity-removal portion of his fabrication process will actually be successful in removing the indicated part of the asperities. Furthermore, the ion implant used in the asperity removal inevitably entails a critical lithographic masking step to avoid damaging the select portion of the FET. This is disadvantageous. Because the first polysilicon was made electrically conductive prior to the asperity-removal implant, there is a significantly increased risk that this implant will degrade the integrity of the gate dielectric. Consequently, it is highly desirable to have a better selective asperity-definition technique that can be used to fabricate an EEPROM having the general characteristics of Hazani's device.

GENERAL DISCLOSURE OF THE INVENTION

The present invention provides such a technique.

In the basic asperity-definition procedure of the invention, the initial step is to create a first patterned layer of nonmonocrystalline semiconductor material on the upper surface of a substructure. Nonmonocrystalline semiconductor material could, for example, be polycrystalline or amorphous in crystal structure. A thermal oxidation is performed to grow a main electrically insulating layer of semiconductor oxide along the first patterned layer. The oxidation is done in such a way that the upper lateral edge of the remainder of the first patterned layer forms an asperity that protrudes outward. The thickness of the insulating layer along the asperity is less than the average thickness of the insulating layer. If the semiconductor material is silicon, the oxidation is preferably done at 800°–950° C.

A blanket layer, preferably consisting of nonmonocrystalline semiconductor material, is formed over the insulating layer and over adjoining material of the substructure. Using a primary etchant that attacks the material of the blanket and patterned layers more than the material of the insulating layer, a selective etch is performed to remove the entire thickness of a specified section of the blanket layer located above the first patterned layer. The selective etch is continued past the blanket layer in order to remove at least part of the underlying exposed section of the insulating layer, including the portion located along the upper surface of the underlying part of the asperity, and then, importantly, to remove the underlying part of the asperity.

The remainder of the blanket layer forms a second patterned layer located above the remainder of the asperity. Thus, by performing the indicated type of etch, one part of the asperity is removed while another part remains. The primary etchant typically etches the nonmonocrystalline semiconductor material at least ten times greater than the semiconductor oxide.

Part of the exposed section of the insulating layer may remain after the selective etching step. If so, this part of the insulating layer is normally removed with an additional etchant that attacks the semiconductor oxide more than the nonmonocrystalline semiconductor material. The additional etchant is thus of opposite selectivity to the primary etchant. The additional etchant typically etches the semiconductor oxide at least ten times greater than the nonmonocrystalline semiconductor material.

The etching process completes the actual selective asperity definition. However, avoiding new asperities is important. Accordingly, a further insulating layer is usually provided along the second patterned layer and along the part of the remainder of the first patterned layer not covered by the second patterned layer in such a way as to significantly inhibit further asperity formation along the upper lateral edge of the remaining portion of the first patterned layer. If the semiconductor material is silicon, the further insulating layer can be created by an oxidation at 1050°–1150° C. Alternatively, the further insulating layer can be formed by a deposition step.

The present selective asperity definition technique is particularly useful in fabricating a floating-gate FET for a double-control-gate programmable element of an electrically alterable circuit such as an EEPROM or an EEPLD. In this case, the above-mentioned substructure comprises a monocrystalline semiconductor substrate and a gate dielectric layer formed along part of the upper surface of the substrate. The first patterned layer is created over a section of the dielectric layer.

At this point, the above-mentioned steps involved in the selective asperity definition, including formation of the further insulating layer, are performed in the indicated manner.

Accordingly, a discussion of these steps is not repeated here. However, the substructure generally includes a thick field insulating region that adjoins the gate dielectric layer along the upper surface of the substrate. If so, the blanket layer is usually formed over parts of the field region and the dielectric layer (in addition to being formed over the main insulating layer). Also, the etching process is performed in such a way that at least one portion of the second patterned layer is located above the field region.

After the further insulating layer is created, an additional patterned layer of metallic or nonmonocrystalline semiconductor material is provided over a portion of the further insulating layer located directly above at least part of the remaining portion of the first patterned layer. Finally, source and drain zones separated by a channel region are formed in the substrate along its upper surface.

In the FET structure, the remaining portion of the first patterned layer is the floating gate. The portion of the (remaining) second patterned layer located above the floating gate forms the erase gate. The portion of the (remaining) third patterned layer overlying the channel region is the control gate.

The remainder of the asperity on the floating gate lies fully below the erase gate. This enables electrons to tunnel very efficiently between the floating and erase gates during erasure without causing any undesired tunneling during the programming and read periods. The erase voltage is typically 10 volts. The programming voltage is about 12 volts.

The selective asperity definition technique of the present invention is relatively simple. As demonstrated by the experimentation discussed in the description of the preferred embodiments, the selective etch is completely successful in removing the unwanted part of the asperity. In contrast to Hazani, the present asperity definition procedure does not require an additional critical lithographic step. Nor is the integrety of the gate dielectric layer endangered by an ion implant such as that used in Hazani's asperity removal procedure.

BRIEF DESCRIPTION OF THE DRAWINGS

FIGS. 1c, 1d, 1g, 1i, and 1j are taken respectively through the like-numbered planes in FIGS. 2a, 2c, 2d, 2e, and 2g. In turn, FIGS. 2a, 2c, 2d, 2e, and 2g are taken respectively through the like-numbered planes in FIGS. 1c, 1d, 1g, 1i, and 1j.

FIGS. 4a and 4b illustrate parts of the structure at the stage generally shown in FIG. 1i.

Like reference symbols are employed in the drawings and in the description of the preferred embodiments to represent the same or very similar item or items.

DESCRIPTION OF THE PREFERRED EMBODIMENTS

Referring to the drawings, FIGS. 1a-1j and 2a-2g illustrate how an n-channel floating-gate FET for a double-control-gate memory cell of a flash EEPROM is fabricated according to the invention using a highly efficient technique for selectively defining asperities on a fully insulated floating gate. In addition to the floating gate, the principal semiconductive and electrically conductive elements of the FET are an n-type source, an n-type drain, a channel extending between the source and drain, a (main) control gate, and an erase (control) gate. Electrical insulation is provided with a memory gate dielectric between the channel and floating gate, a select gate gate dielectric between the channel and control gate, a control inter-gate dielectric between the floating and control gates, and an eraser inter-gate dielectric between the floating and erase gates.

Conventional cleaning and photoresist masking techniques are utilized in the fabrication process described below. References to the cleaning steps, to the steps involving in making photoresist masks, and to other such well-known semiconductor processing steps are omitted from the following description to simplify the discussion.

Figure 1A:
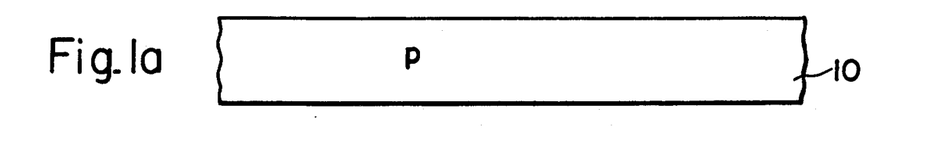
FIGS. 1a–1j and 2a–2g are cross-sectional side structural views representing steps in a process for manufacturing an FET for an EEPROM cell in accordance with the invention. The views of FIGS. 1a–1j are perpendicular to those of FIGS. 2a–2g.
Figure 1B:
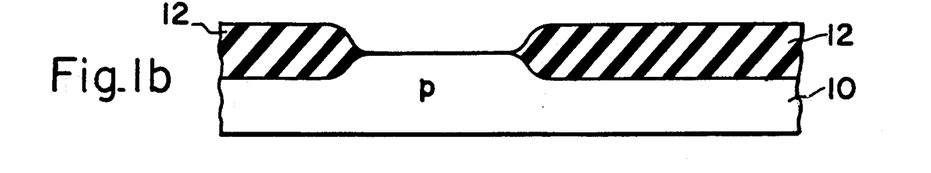

The starting point is a flat (100) p-type monosilicon semiconductor substrate 10 as indicated in FIG. 1a. Although substrate 10 is shown as a separate body, it could be part of a larger semiconductor body. The terms "lower", "upper", "side", "below", "above", "vertical", "lateral", and the like are defined (for convenience) with respect to the orientation of substrate 10 when its lower surface is parallel to the ground. Substrate 10 has a resistivity of 17-33 ohm-cm.

A group of thick recessed electrically insulating field regions 12 of silicon dioxide are formed along parts of the upper surface of substrate 10 according to the well-known "LOCOS" technique. See FIG. 1b. Field-oxide regions 12 have a thickness of about 800 nm. A p-type channel-stop region (not shown in the drawings) may be provided along the lower surfaces of regions 12. The portion of substrate 10 between the sides of regions 12 is an active semiconductor island.

Figure 1C:
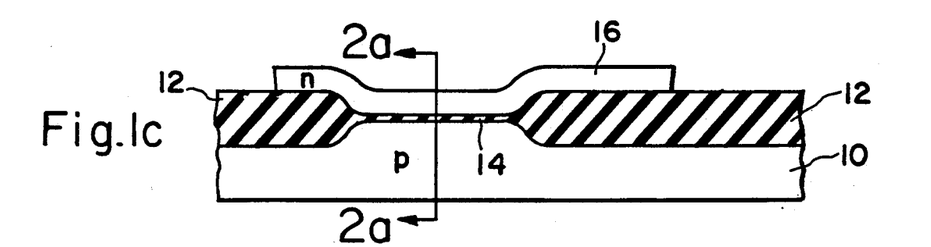
Figure 1D:
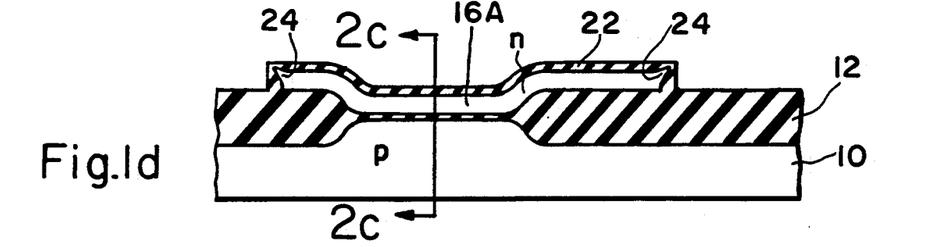
Figure 2A:
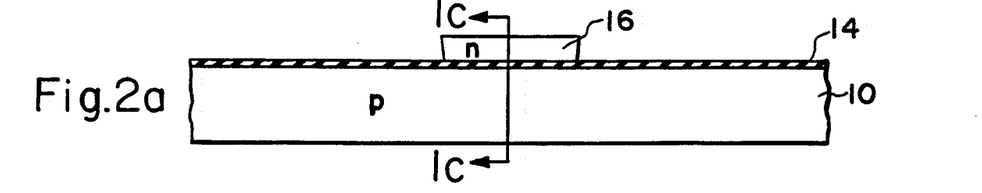

A thin memory gate dielectric layer 14 continuous with field regions 12 is provided along the upper surface of the active portion of substrate 10 as depicted in FIGS. 1c and 2a. Dielectric layer 14 has a thickness of 20-30 nm. Layer 14 preferably consists of thermally grown silicon dioxide but could be formed with other materials such as silicon dioxide or a combination of silicon dioxide and silicon nitride.

The first step in the asperity definition technique is to establish the basic outline for the floating gate. In particular, a first patterned layer 16 of n-type nonmonocrystalline silicon ("nonmonosilicon") is deposited on the substructure formed by substrate 10, field regions 12, and dielectric layer 14. Patterned nonmonosilicon layer 16, which later becomes the floating gate, lies on a section of dielectric layer 14 and extends over adjoining sections of field regions 12. See FIGS. 1c and 2a. Layer 16 is preferably created by depositing 250 nm of polysilicon or amorphous silicon, diffusing phosphine into the deposited silicon to make it electrically conductive, and performing a conventional selective plasma etch to remove the undesired part of the doped silicon. The phosphine diffusion is done for 10 minutes at 900°-950° C. to attain a sheet resistance of 20 ohms/square.

Figure 2B:
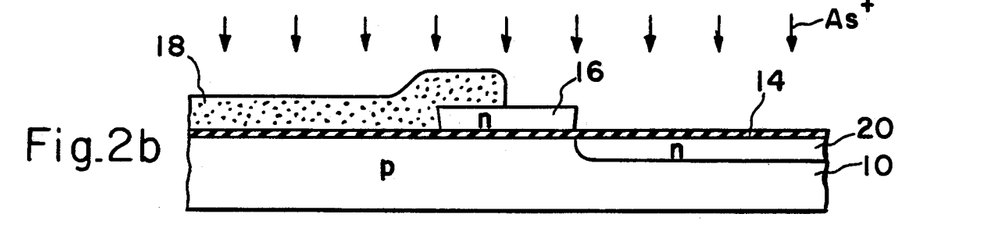
Figure 2C:
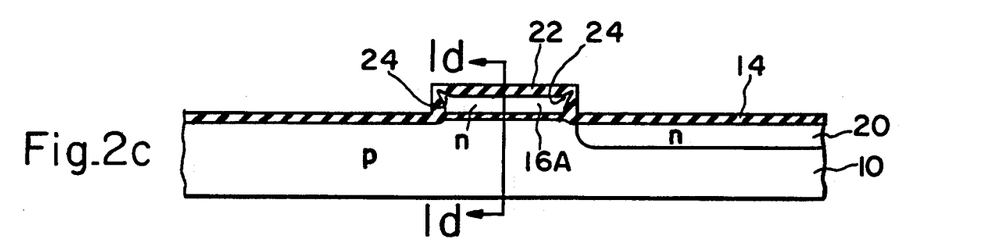
Figure 2D:
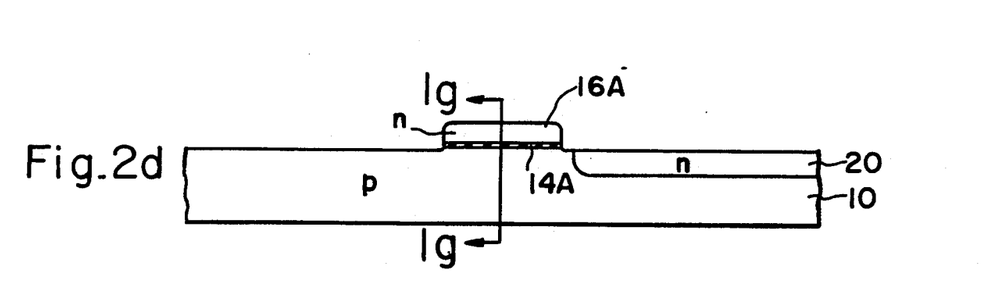

Turning to FIG. 2b, a non-critical photoresist mask 18 is created on layers 14 and 16 and over the portion of substrate 10 generally intended for the source of the FET. Using patterned layer 16 and mask 18 as an implantation shield, arsenic in the form of As+ is ion implanted through dielectric layer 14 into a portion of substrate 10 to form a first surface-adjoining n-type drain zone 20. The implantation dosage and energy are $1 \times 10^{15}$ ions/cm$^2$ and 50 kiloelectron volts (KEV). Photoresist 18 is subsequently removed.

A low-temperature oxidation is performed to grow a main electrically insulating layer 22 of silicon dioxide to a thickness of 30-60 nm along the upper and lateral surfaces of patterned layer 16. See FIGS. 1d and 2c. The oxidation is done at a temperature in the range of 800°-950° C. so that the entire upper lateral edge of the remainder 16A of layer 16 forms a cusp-shaped asperity 24 protruding upward and laterally outward. The thickness of layer 22 along asperity 24 is considerably less than the average thickness of layer 23. The oxide thickness along asperity 24 is normally slightly less than half the average oxide thickness. Other lesser asperities (not shown in the drawings) exist along the upper surface of layer 22. During the oxidation, the portions of dielectric layer 14 situated to the sides of layers 16 (or 16A) increase somewhat in thickness.

The low-temperature oxidation is done in an environment of either dry or wet oxygen. The oxidation time is 30-60 minutes depending on temperature, oxidation environment, and oxide thickness. The temperature, thickness, and time are preferably 900° C., 45 nm, and 30-35 minutes.

Figure 1E:
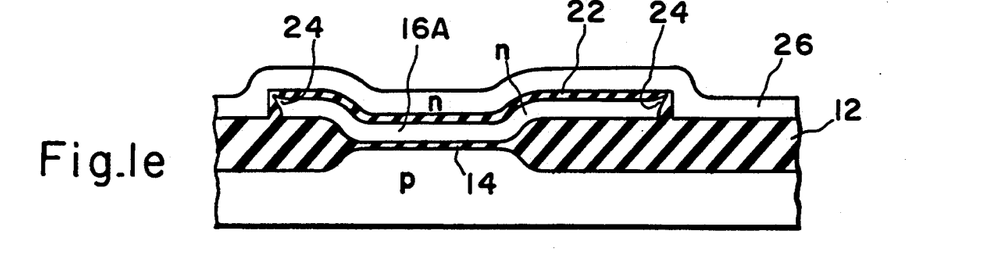

A blanket layer 26 of n-type nonmonosilicon is formed on oxide layer 22 and on adjoining material of field regions 12 as shown in FIG. 1e. Blanket nonmonosilicon layer 26 also lies on the thicker portions of dielectric layer 14 situated to the sides of nonmonosilicon layer 16A. Layer 26 is preferably created by depositing 250 nm of polysilicon or amorphous silicon and then diffusing phosphine into the deposited silicon to make it electrically conductive. The phosphine doping is done for 10 minutes at 900°-950° C. to provide layer 26 with a sheet resistance of 20 ohms/square.

A photoresist mask 28 is formed on a portion of blanket layer 26 lying on one of field regions 12 and extending over a portion of nonmonosilicon layer 16A that also lies on that particular region 12. See FIG. 1f. Using mask 28 as an etch shield, the entire thickness of the exposed section of blanket layer 26 is removed with an anisotropic etchant that attacks the nonmonosilicon of layers 26 and 16A at a much greater rate than the silicon dioxide of layer 22. The nonmonosilicon-to-silicon dioxide selectivity of the etchant is normally at least 10 and is preferably 20 or more. The remaining portion 26A of blanket layer 26 is a second patterned n-type nonmonosilicon layer, part of which later becomes the erase gate.

Figure 1F:
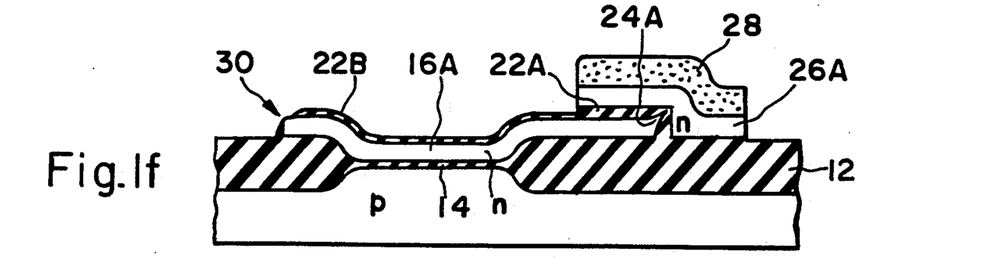

The anisotropic etch is continued into oxide layer 22 to remove part of the exposed section of layer 22, including the entire thickness of the portion of layer 22 located along the upper surface of the part of asperity 24 not covered by second patterned layer 26A and photoresist 28. This occurs because layer 22 has considerably reduced thickness along asperity 24. The etch is then continued slightly further to remove the so exposed part of asperity 24—i.e., the part not covered by patterned nonmonosilicon layer 26A and mask 28. The etch is normally stopped before any other part of nomonsilicon remainder 16A is exposed.

FIG. 1f shows the structure at the end of the anisotropic etch. Item 22A is the portion of oxide layer 22 covered by layer 26A and photoresist 28. Item 22B is the remainder of the exposed portion of oxide layer 22. Item 30 indicates where nonmonosilicon layer 16A was exposed and asperity 24 partly removed. Patterned layer 26A overlies the remaining part 24A of asperity 24.

The anisotropic etch is performed for 35–45 seconds with a plasma consisting of sulfur hexafluoride and oxygen. The $SF_6:O_2$ flow ratio is 4:1 at 350 millitorr. the RF power is 100 watts.

With mask 28 still in place, oxide portion 22B is removed with an additional etchant that attacks the silicon dioxide of layer 22B at a much greater rate than the nonmonosilicon of layers 16A and 26A. See FIGS. 1g and 2e. The silicon dioxide-to-nonmonosilicon selectivity of the additional etchant is usually at least 10 and is preferably 20 or more. The etch is preferably done in an anisotropic manner for about 60 seconds using a plasma formed with trifluoromethane, helium, and carbon dioxide. The $CHF_3:He:CO_2$ flow rate is 4:27:36 at 70–75 millitorr. The RF power is 1100 watts. The etch may also be done isotropically with a standard chemical oxide etchant such as a hydrofluoric-acid solution. Photoresist 28 is removed subsequent to the etch. This basically complete the selective asperity definition.

During the two etch steps using mask 28, the portions of dielectric layer 14 situated to the sides of nonmonosilicon layer 16A are also removed. See FIG. 2d. Memory gate dielectric 14A is the remainder of layer 14.

Figure 1G:
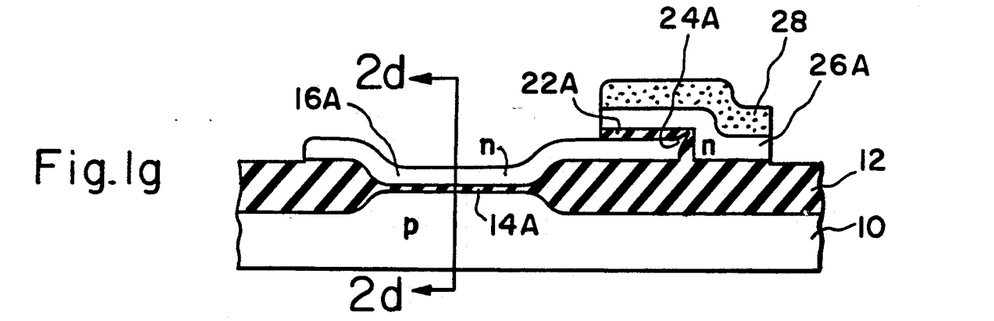
Figure 1H:
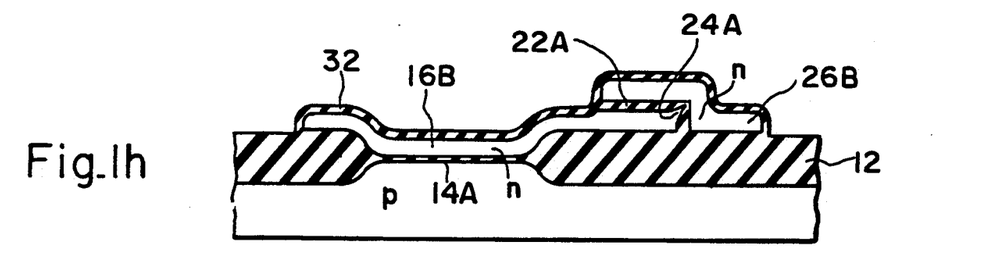
Figure 2E:
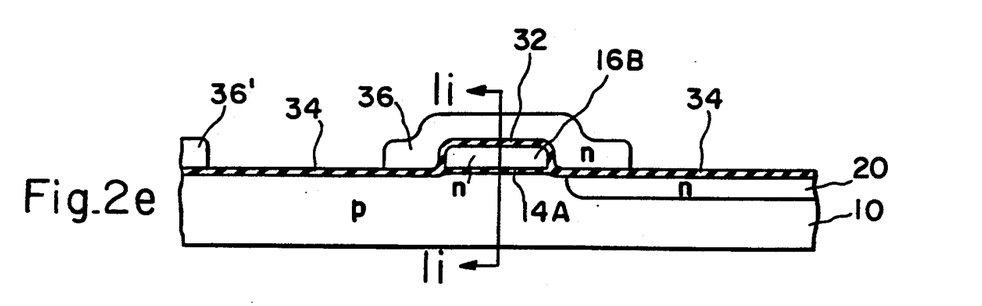

A high-temperature oxidation is performed to grow a further electrically insulating layer 32 of silicon dioxide to a thickness of 30–60 nm along the upper and lateral surfaces of patterned nonmonosilicon layer 26A and along the upper and lateral surfaces of the portion of nonmonosilicon layer 16A not covered by layer 26A. FIG. 1h shows the resulting structure. The remaining portion 16B of nonmonosilicon layer 16A is the floating gate. Nonmonosilicon layer 26B is the remainder of patterned layer 26A. The portion of nonmonosilicon remainder 26B overlying floating gate 16B generally forms the erase gate. During the oxidation, thin select gate dielectric layers 34 of silicon dioxide grow from the monosilicon at the sides of floating gate 16B as indicated in FIG. 2e.

the high-temperature oxidation is done at a temperature in the range of 1050°–1150° C. This substantially inhibits any further asperity formation along the upper lateral edge (and upper surface) of floating gate 16B. The high temperature also inhibits any significant asperities from being formed along the upper lateral edge (and upper surface) of nonmonosilicon layer 26B.

The high-temperature oxidation is done in either dry or wet oxygen. The dry environment is preferred. The oxidation time is 3–10 minutes depending on temperature, oxidation environment, and oxide thickness. The temperature, thickness, and time preferably are 1150° C., 40 nm, and 3 minutes.

A third patterned layer 36 of n-type nonmonosilicon is formed on oxide layers 32 and 34 above part of nonmonosilicon layer 26B and above substantially all of floating gate 16B. See FIGS. 1i and 2e. Third patterned layer 36 is preferably created by depositing 500 nm of polysilicon or amorphous silicon, diffusing phosphine into the deposited silicon to make it electrically conductive, and performing a selective plasma etch to remove the undesired part of the deposited silicon. This phosphine diffusion is done for 10 minutes at 900°–950° C. to achieve a sheet resistance of 20 ohms/square. Item 36' in FIG. 2e is another simultaneously created n-type patterned nonmonosilicon layer that is utilized in a floating-gate FET of an adjoining mirror-image EEPROM cell.

Using patterned layers 36 and 36' as an implantation shield, arsenic in the form of $As^+$ is ion implanted through oxide layer 34 into two portions of substrate 10 laterally separated by a channel region to define a heavily doped surface-adjoining n-type source zone 38 and a heavily doped second surface-adjoining n-type drain zone 40 continuous with first drain zone 20. See FIG. 2f. The implantation dosage and energy are $5 \times 10^{15}$ ions/$cm^2$ and 70–100KEV.

A source/drain anneal is performed for 30 minutes at 900° C. in dry oxygen to repair implant lattice damage, activate the implanted n-type dopants, and drive them outward. Source zone 38 expands to the shape generally indicated in FIG. 2g. Drain zones 20 and 40 expand to become a composite n-type drain zone 42 that extends slightly below floating gate 16B. Thin electrically insulating layers 44 and 44' of silicon dioxide respectively grow along patterned layers 36 and 36' during the anneal. Items 36A and 36A' respectively indicate the remainders of layers 36 and 36'.

Figure 1I:
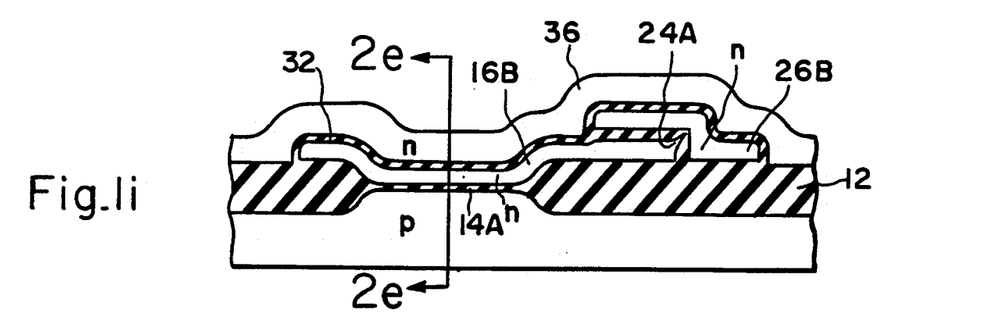
Figure 1J:
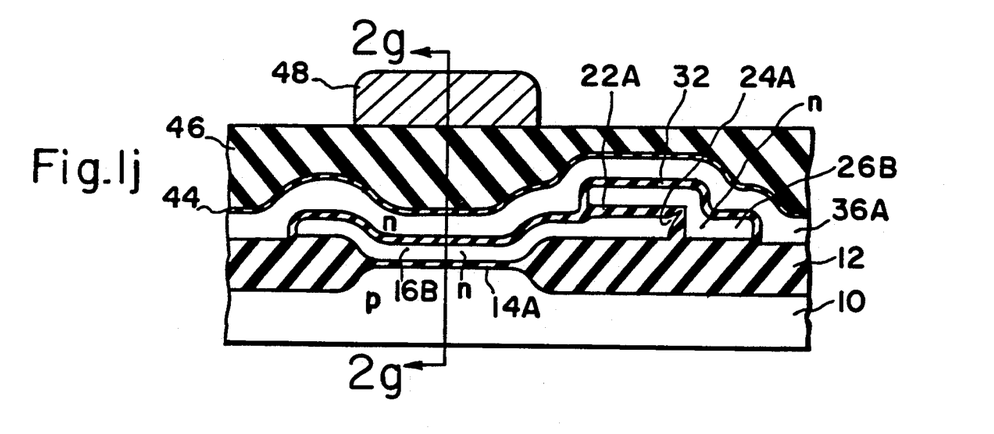
Figures 2F, 2G:
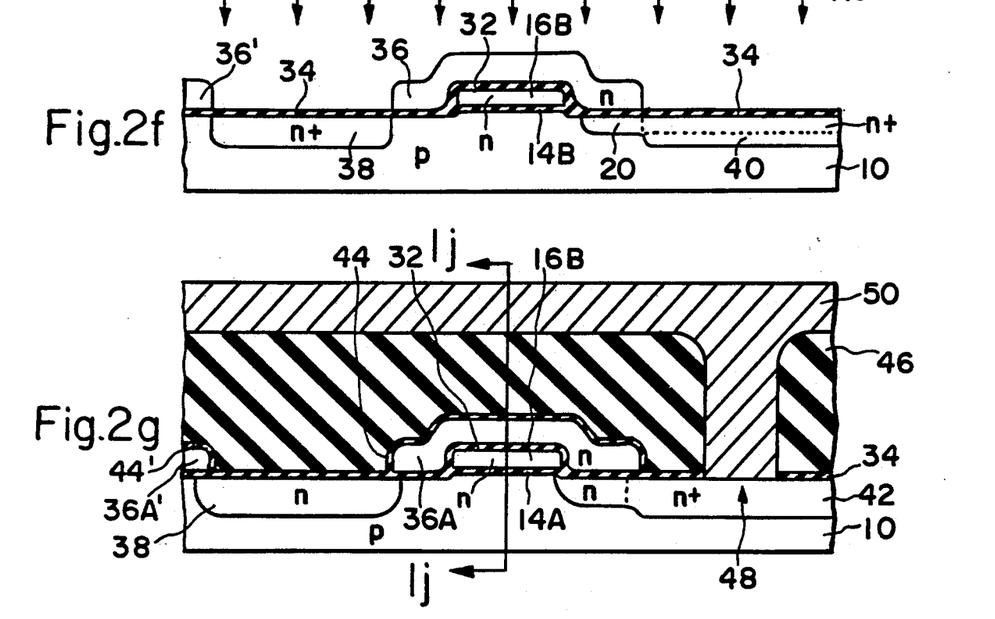

The basic EEPROM cell is now completed in the conventional manner indicated in FIGS. 1j and 2g. A planarized electrically insulating layer 46 consisting of borophosphosilicate glass is formed on the upper surface of the structure. A contact opening 48 is etched through insulating layers 46 and 34 down to drain 42. A blanket layer of metal such as aluminum with 1% silicon and 1% copper is deposited on the upper surface of the structure and into contact opening 48. Finally, the metal layer is patterned to form a metal bit line 50.

At the end of fabrication, the FET channel region is divided into (a) a memory part that lies directly under floating gate 16B and (b) a select part that extends between source zone 38 and the memory part. In particular, the dividing place for the two parts of the channel occur approximately along the plane running vertically through the left-hand side of floating gate 16B in FIG. 2g. The FET thus consists of a memory portion and a select portion integral with the memory portion.

The control gate is generally formed by the portion of nonmonosilicon layer 36A lying over the channel region. More specifically, the control gate consists of the portion of layer 36A located directly above floating gate 16B and extending laterally beyond it over the select part of the channel. Again, see FIG. 2g. Oxide layer 22A is the erase inter-gate dielectric. The portion of oxide layer 32 between floating gate 16B and the control gate portion of layer 36A forms the control inter-gate dielectric.

If the material initially used to form any of layers 16B, 26B, and 36A was amorphous silicon, the elevated temperatures during the various heating steps cause the amorphous silicon to become polysilicon. Consequently layer 16B, 26B, and 36A are all polysilicon in the final cell.

The invention provides some important advantages beyond those described above for the asperity definition technique. Growing oxide layer 22 to a thickness of 30–60 nm is much easier from a manufacturing viewpoint than the thickness of 8–10 nm used in forming the erase inter-gate dielectric in many other EEPROM cells. The threshold voltage of the select portion of the FET is not significantly affected by the charge on floating gate 16B. As a result, there is virtually no possibility that the memory cell will turn into an always-on (i.e., depletion-mode) device if the cell is overerased.

Figure 3:
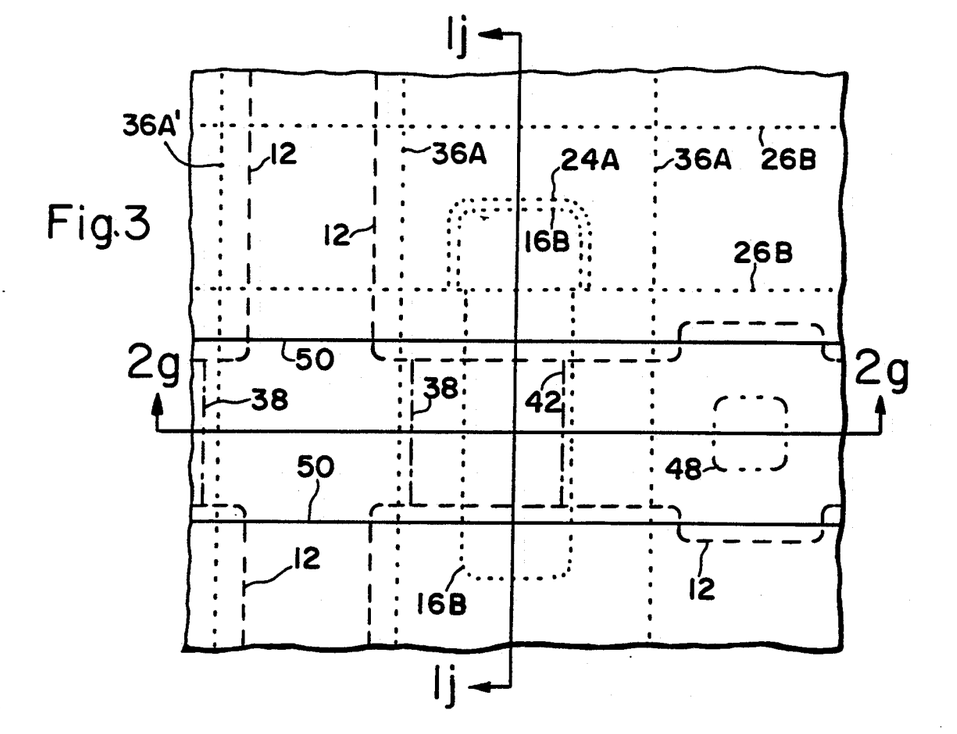
FIG. 3 is a layout view for the cell structure of FIGS. 1j and 2g.

FIG. 3 illustrates a layout view of the structure shown in FIGS. 1j and 2g. As indicated by the presence of patterned layers 36A', source zone 38 is shared with the mirror-image EEPROM cell to the left. Likewise, drain zone 42 and contact opening 48 are shared with the floating-gate FET of a mirror-image EEPROM cell to the right.

Figure 4A:
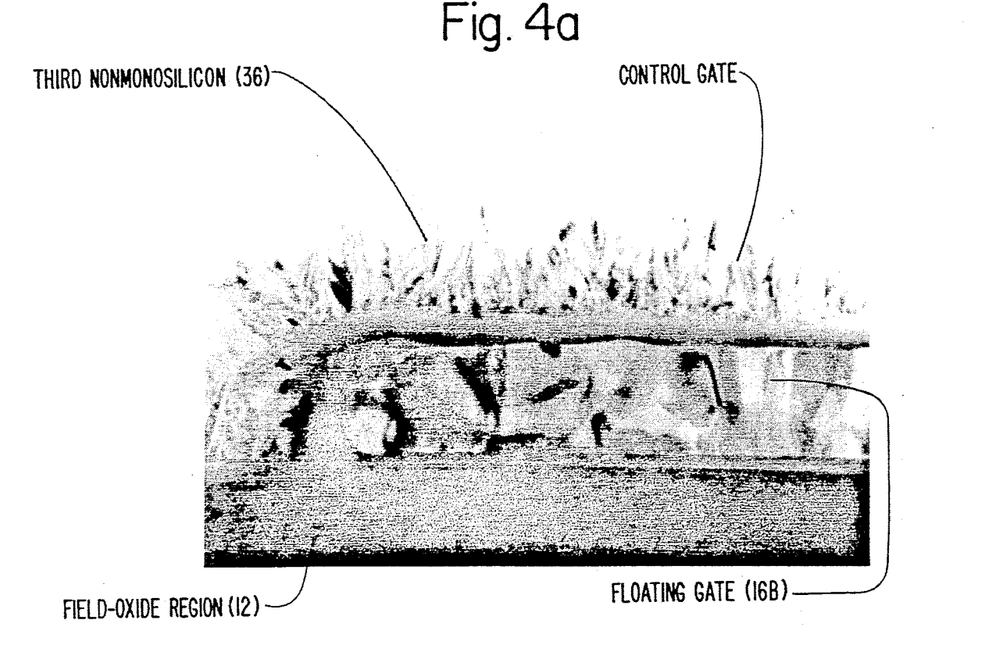
FIGS. 4a and 4b are cross-sectional scanning electron micrographs of a partially finished EEPROM cell of the invention.
Figure 4B:
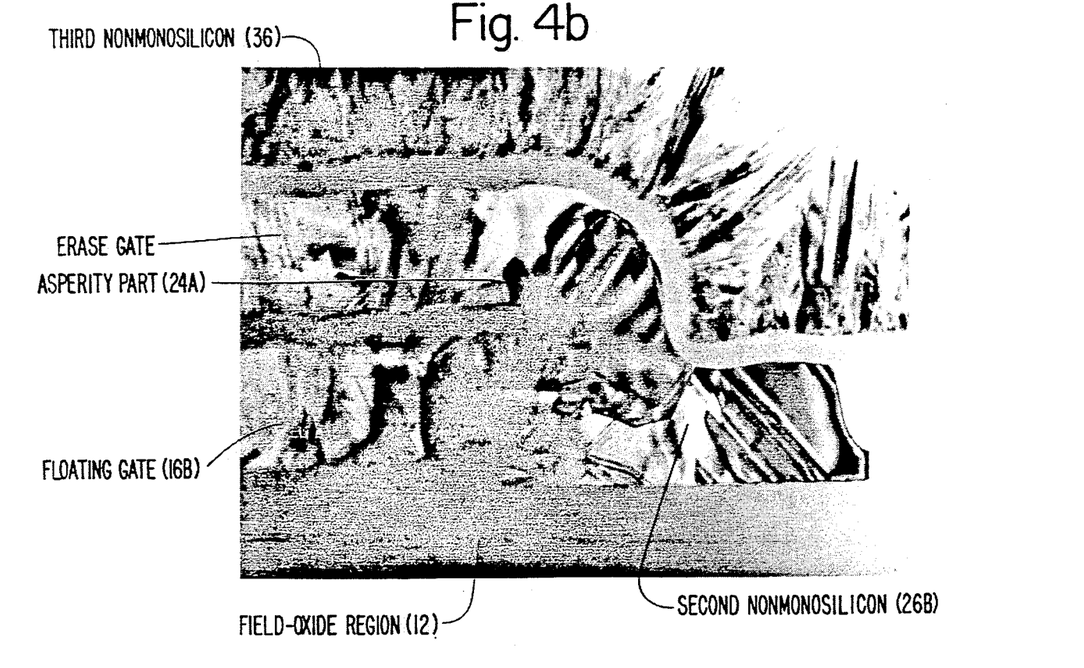

FIGS. 4a and 4b show cross sections of an actual EEPROM cell fabricated in accordance with the invention up through the step shown in FIG. 1i. FIG. 4a shows that no part of an asperity is located along the upper lateral edge of the portion of floating gate 16B not covered by nonmonosilicon layer 26B. FIG. 4b illustrates the cusp-shaped nature of asperity part 24A situated along the upper lateral edge of the portion of floating gate 16B covered by layer 26B.

The process of the present invention is subject to a number of variations. For example, insulating layer 32 could be formed by depositing silicon dioxide rather than thermal oxidation.

Figure 5A:
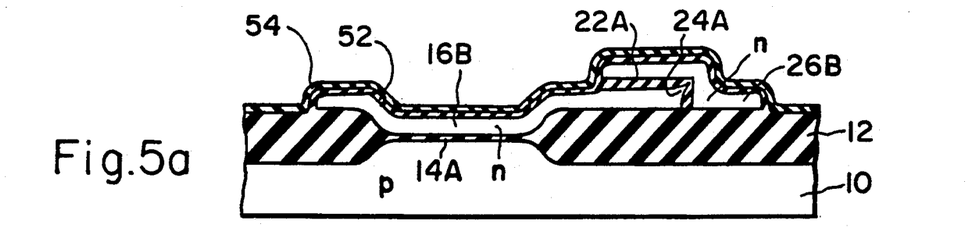
FIGS. 5a and 5b are cross-sectional side structural views representing alternative steps to that of FIG. 1h.
Figure 5B:
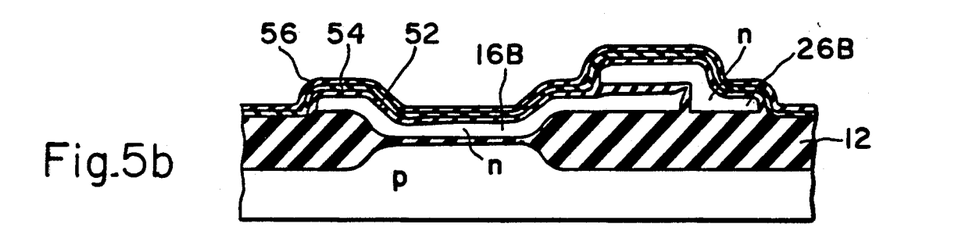

Another variation is to replace oxide layer 32 with a silicon dioxide/silicon nitride/silicon dioxide ("ONO") sandwich. FIGS. 5a–5b illustrate this variation. The process is as follows.

After removing photoresist mask 28 in the structure of FIG. 1g, a lower sublayer 52 of silicon dioxide is provided on the upper surface of the structure to a thickness of 10–20 nm. See FIG. 5a. Oxide sublayer 52 can be created by thermal oxidation at 900°–1150° C. for ten minutes in dry or wet oxygen. The dry environment is preferred. Alternatively, layer 52 may simply be deposited. In any case, an intermediate sublayer 54 of silicon nitride is deposited to a thickness of 10–20 nm on sublayer 52. Nitride sublayer 54 largely overcomes any asperity problem that arises if sublayer 52 is created by thermal oxidation at 900° C.

The ONO sandwich is completed by performing a thermal oxidation to grow an upper sublayer 56 of silicon dioxide along the upper surface of sublayer 54 as shown in FIG. 5b. Oxide sublayer 56 has a thickness of 2–4 nanometers. The oxidation is done at 900°–1000° C. for 120–240 minutes in dry or wet oxygen. The wet environment is preferred. The rest of the process can then proceed as described above.

Figure 6:
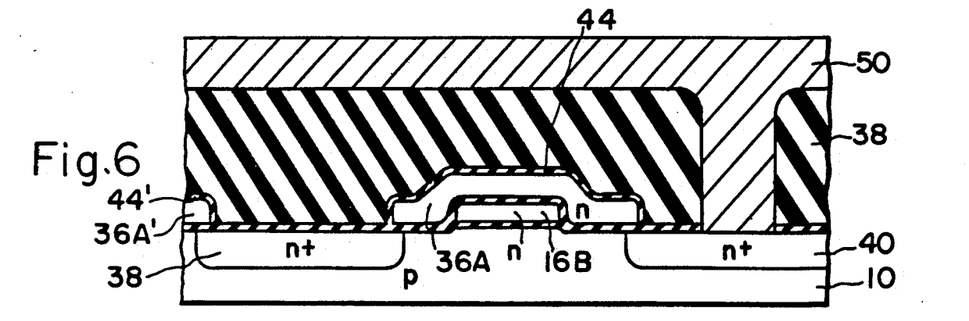
FIG. 6 is a cross-sectional side structural view representing an alternative structure to that of FIG. 2g.

The implantation step shown in FIG. 2b to form first drain zone 20 can be deleted. The final structure then appears as depicted in FIG. 6 in which drain zone 40 is the drain. While this variation saves a masking step, drain zone 40 may be too far from floating gate 16B to get adequate injection during programming.

Figure 7A:
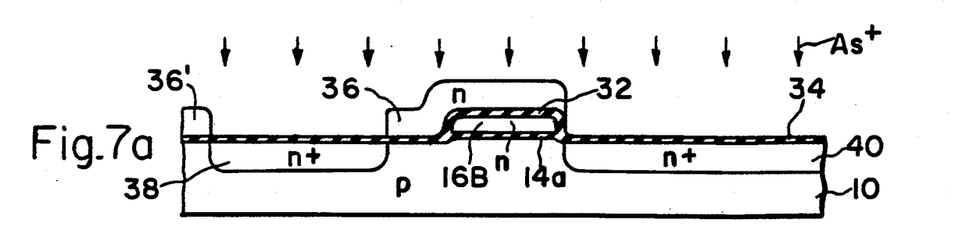
FIG. 7a and 7b are cross-sectional side structural views representing alternative steps to those of FIGS. 2f and 2g.
Figure 7B:
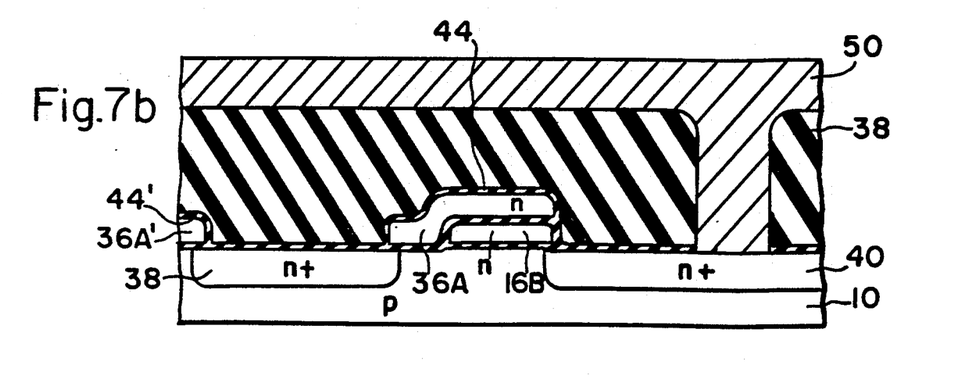

FIGS. 7a and 7b show one way of approaching the drain-to-floating gate spacing problem without using the implantation to form first drain zone 20. With reference to FIG. 7a, the side of nonmonosilicon layer 36 nearest the intended drain location is placed in general vertical alignment with the corresponding side of floating gate 16B. This brings drain zone 40 closer to gate 16B during the source/drain implantation in which layer 36 acts as an implantation shield. After the source/drain anneal, drain zone 40 ideally extends slightly under gate 16B. See FIG. 7b. The difficulty with this approach is that drain zone 40 may sometimes end up too far from floating gate 16B due to masking tolerances during the fabrication of layers 16B and 36.

Figure 8:
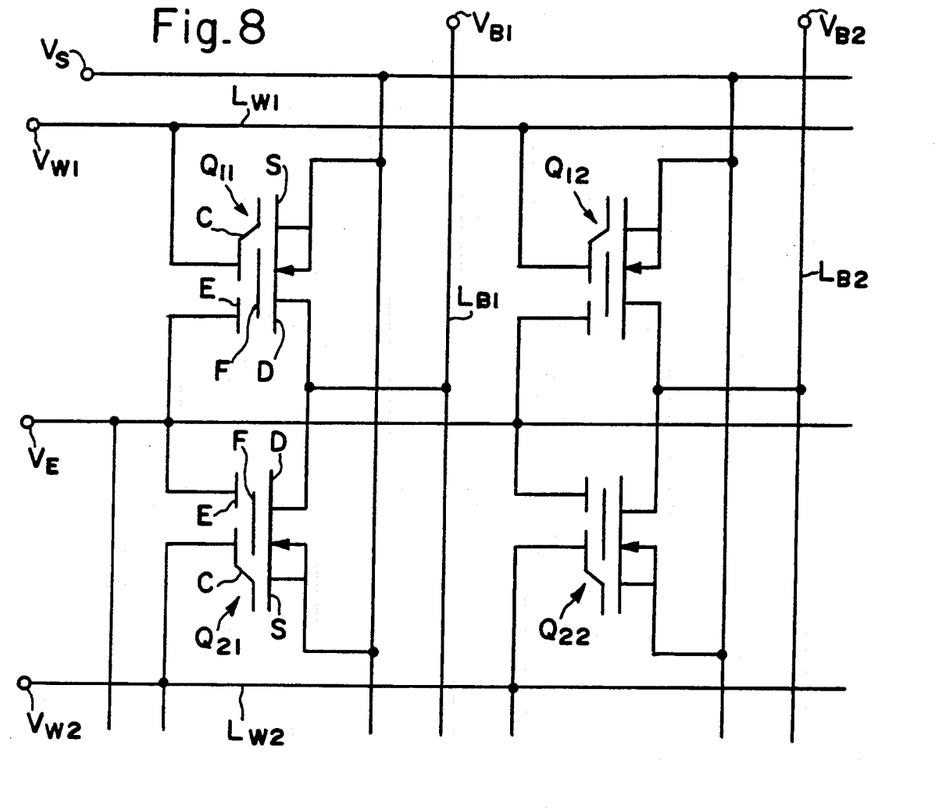
FIG. 8 is a circuit diagram of a portion of a flash EEPROM fabricated according to the invention.

Turning to FIG. 8, it illustrates a circuit configuration for four memory cells of the present EEPROM. Each memory cell consists of an n-channel floating-gate FET $Q_{ij}$ (where i and j are both integers running from 1 to 2) fabricated according to the process of FIGS. 1a–1j and 2a–2g. The symbols S, D, F, E, and C respectively indicate the source, drain, floating gate, erase gate, and (main) control gate for each FET $Q_{ij}$ in FIG. 8.

Voltages $V_{W1}$ and $V_{W2}$ are respectively transmitted on word lines $L_{W1}$ and $L_{W2}$ connected in the indicated manner to control gates C in FIG. 8. All of erase gates E are connected to a line carrying voltage $V_E$ to enable all of the EEPROM cells to be erased at the same time. Voltages $V_{B1}$ and $V_{B2}$ are respectively transmitted on bit lines $L_{B1}$ and $L_{B2}$ connected in the indicated way to drains D. All of sources S are connected to a line carrying voltage $V_S$.

Figure 9A:
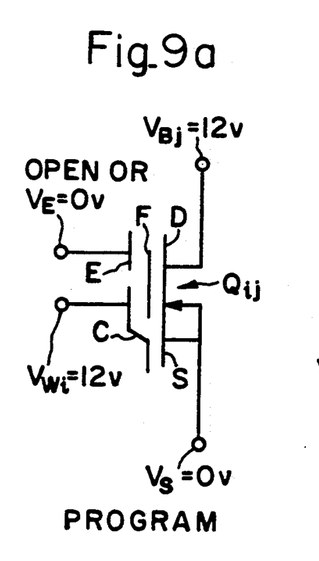
FIGS. 9a, 9b, and 9c are circuit diagrams respectively illustrating the program, erase, and read operations for an EEPROM cell of the invention.
Figure 9B:
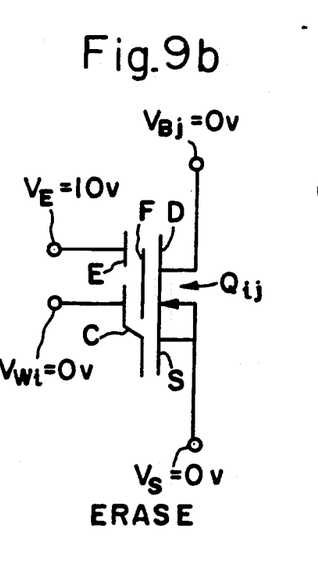
Figure 9C:
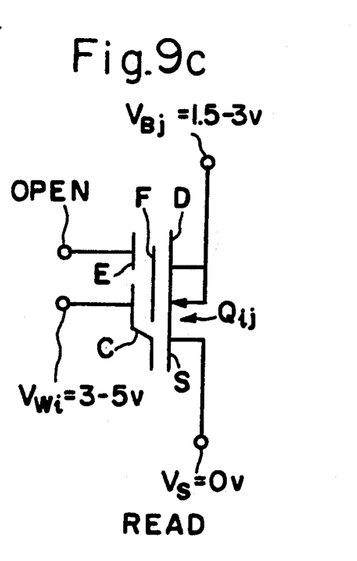

FIGS. 9a–9c display typical conditions that need to be achieved during programming, erasure, and read for each FET $Q_{ij}$ in FIG. 8. By using the programming conditions shown in FIG. 9a, hot electrons move from source S to drain D. Due to the high voltage (12 volts) on control gate C, some of the hot electrons near drain D are injected through the memory gate dielectric onto floating gate F to place it in the highly charged state. The FET threshold voltage reaches 7–7.5 volts. Similarly, by using the erase conditions shown in FIG. 9b, electrons on floating gate F tunnel through the erase inter-gate dielectric to erase gate E. Floating gate F returns to the lowly charged state. Asperity part 24A, which is located on floating gate F but is not shown in FIGS. 9a–9c, enhances the tunneling significantly. The FET threshold voltage drops to 2–2.5 volts.

During read, control gate C is placed at a voltage between the high and low threshold values. As indicated in FIG. 9c, the read voltage is 3–5 volts. FET $Q_{ij}$ then conducts if the threshold voltage is at the low value but not if the threshold voltage is at the high value.

While the invention has been described with reference to particular embodiments, this description is solely for the purpose of illustration and is not to be construed as limiting the scope of the invention claimed below. For example, the floating-gate FET could be used as a programmable element in an EEPLD or another integrated circuit that contains electrically erasable programmable circuitry. The third patterned layer could be formed with metal instead of nonmonosilicon. Some of the ion implantations could be replaced by diffusions.

Semiconductor elements of opposite conductivity to those described above might be used to accomplish the same results; rather than using the hole tunneling from the floating gate to the erase gate, it might be necessary to use electron tunneling from the erase gate to the floating gate. Various modifications and applications may be thus made by those skilled in the art without departing from the true scope and spirit of the invention as defined in the appended claims.

I claim:

1. A method in which a first patterned layer of nonmonocrystalline semiconductor material is created on a substructure along its upper surface, characterized by the steps of:

performing a thermal oxidation to grow a main electrically insulating layer of oxide along the first patterned layer in such a way that the upper lateral edge of the remainder of the first patterned layer forms an asperity that protrudes outward, the thickness of the insulating layer along the asperity being less than the average thickness of the insulating layer;

forming a blanket layer over the insulating layer and over adjoining material of the substructure; and selectively etching the blanket, insulating, and patterned layers with a primary etchant that attacks the material of the blanket and patterned layers more than the material of the insulating layer in order to remove (1) substantially the entire thickness of a specified section of the blanket layer located above the first patterned layer, (2) at least part of the underlying exposed section of the insulating layer including the portion located along the upper surface of the underlying part of the asperity, and (3) largely all of the underlying part of the asperity, whereby the remainder of the blanket layer forms a second patterned layer located above the remainder of the asperity.

2. A method as in claim 1 characterized in that the blanket layer is formed with nonmonocrystalline semiconductor material.

3. A method as in claim 2 characterized in that the primary etchant has a nonmonocrystalline semiconductor material-to-oxide selectivity of at least ten.

4. A method as in claim 2 characterized in that: part of the exposed section of the insulating layer remains after the selective etchhing step; and the method includes the step of substantially removing this part of the insulating layer with an additional etchant that attacks the oxide more than the nonmonocrystalline semiconductor material.

5. A method as in claim 4 characterized in that: the primary etchant has a nonmonocrystalline semiconductor material-to-oxide selectivity of at least ten; and the additional etchant has a semiconductor oxide-to-nonomonocrystalline semiconductor material selectivity of at least ten.

6. A method as in claim 2 wherein the semiconductor material is silicon, characterized in that the thermal oxidation is done at a temperature in the range of 800°–950° C.

7. A method as in claim 2 characterized by the step of providing a further electrically insulating layer along the second patterned layer and along the part of the remainder of the first patterned layer not covered by the second patterned layer in such a way as to significantly inhibit further asperity formation along the upper lateral edge of the remaining portion of the first patterned layer.

8. A method as in claim 7 wherein the semiconductor material is silicon, characterized in that: the thermal oxidation is done at a temperature in the range of 800°–950° C.; and the providing step comprises performing a further thermal oxidation at a temperature in the range of 1050°–1150° C.

9. A method as in claim 8 characterized in that: part of the exposed section of the main insulating layer remains after the selective etching step; and the method includes the step of substantially removing this part of the main insulating layer with an additional etchant attacks the oxide more than the nonmonocrystalline semiconductor material.

10. A method as in claim 7 characterized in that the providing step comprises depositing the further insulating layer.

11. A method as in claim 7 wherein the semiconductor material is silicon, characterized in that the providing step comprises:

forming a lower sublayer of silicon dioxide along the second patterned layer and along the part of the remainder of the first patterned layer not covered by the second patterned layer;

depositing an intermediate layer of silicon nitride on the lower sublayer; and performing a thermal oxidation to grow an upper sublayer of silicon dioxide along the intermediate sublayer.

12. A method as in claim 11 characterized in that the step of forming the lower sublayer comprises performing a thermal oxidation.

13. A method in which a gate dielectric layer is formed along part of the upper surface of a monocrystalline semiconductor substrate of a first conductivity type, and a first patterned layer of nonmonocrystalline semiconductor material is created over a section of the dielectric layer, characterized by the steps of:

performing a thermal oxidation to grow a main electrically insulating layer along the first patterned layer in such a way that the upper lateral edge of the remainder of the first patterned layer forms an asperity that protrudes outward, the thickness of the main insulating layer along the asperity being less than the average thickness of the main insulating layer;

forming a blanket layer over the main insulating layer and the dielectric layer;

selectively etching the blanket layer, the main insulating layer, and the first patterned layer with a primary etchant that attacks the material of the blanket and first patterned layers more than the material of the main insulating layer in order to remove (1) substantially the entire thickness of a specified section of the blanket layer located above the first patterned layer, (2) at least part of the underlying exposed section of the main insulating layer including the portion located along the upper surface of the underlying part of the asperity, and (3) largely all of the underlying part of the asperity, whereby the remainder of the blanket layer forms a second patterned layer located above the remainder of the asperity;

providing a further electrically insulating layer along the second patterned layer and along the part of the remainder of the first patterned layer not covered by the second patterned layer in such a way as to significantly inhibit further asperity formation along the upper lateral edge of the remaining portion of the first patterned layer;

forming an additional patterned layer over a portion of the further insulating layer located directly above at least part of the remaining portion of the first patterned layer; and forming laterally separated source and drain regions of a second conductivity type opposite to the first conductivity type in the substrate along its then-existing upper surface, the remaining material of the patterned layers being electrically conductive.

14. A method as in claim 13 characterized in that: part of the exosed section of the main insulating layer remains after the selective etching step; and the method includes the step of substantially removing this part of the main insulating layer with an additional etchant that attacks the material of the main insulating layer more than the material of the patterned layers.

15. A method in which a field region of electrically insulating material is formed along part of the upper surface of a monocrystalline semiconductor substrate of a first conductivity type, a gate dielectric layer which is much thinner than the field region is formed along another part of the upper surface of the substrate so as to adjoin the field region, and a first patterned layer of nonmonocrystalline semiconductor material is created over a section of the dielectric layer and over an adjoining section of the field region, characterized by the steps of:

performing a thermal oxidation to grow a main electrically insulating layer of oxide along the first patterned layer in such a way that the upper lateral edge of the remainder of the first patterned layer forms an asperity that protrudes outward, the thickness of the main insulating layer along the asperity being less than the average thickness of the main insulating layer;

forming a blanket layer of nonmonocrystalline semiconductor material over the main insulating layer, the field region, and the dielectric layer;

selectively etching the blanket layer, the main insulating layer, and the first patterned layer with a primary etchant that attacks the nonmonocrystalline semiconductor material more than the oxide in order to remove (1) all of the blanket layer located above the first patterned layer except for at least one portion also located above the field region, (2) at least part of the underlying exposed section of the main insulating layer including the portion located along the upper surface of the underlying part of the asperity, and (3) largely all of the underlying part of asperity, whereby the remainder of the blanket layer forms a second patterned layer of nonmonocrystalline semiconductor material located above the remainder of the asperity;

providing a further electrically insulating layer along the second patterned layer and along the part of the remainder of the first patterned layer not covered by the second patterned layer in such a way as to significantly inhibit further asperity formation along the upper lateral edge of the remaining portion of the first patterned layer;

forming an additional patterned layer of metallic or nonmonocrystalline semiconductor material over a portion of the further insulating layer located directly above at least part of the remaining portion of the first patterned layer; and forming laterally separated source and drain regions of a second conductivity type opposite to the first conductivity type in the substrate along its then-existing upper surface, the remaining material of the patterned layers being electrically conductive.

16. A method as in claim 15 characterized in that: part of the exposed section of the main insulating layer remains after the selective etching step; and the method includes the step of substantially removing this part of the main insulating layer with an additional etchant that attacks the oxide more than the nonmonocrystalline semiconductor material.

17. A method as in claim 16 characterized in that: the primary etchant has a nonmonocrystalline semiconductor material-to-oxide selectivity of at least ten; and the additional etchant has an oxide-to-nonmonocrystalline semiconductor material selectivily of at least ten.

18. A method as in claim 15 characterized in that the step of forming the source and drain zones comprises:

selectively introducing a dopant of the second conductivity type into the substrate to define a first drain zone of the second conductivity type prior to the step of forming the additional patterned layer; and selectively introducing a dopant of the second conductivity type into the substrate to define a source zone of the second conductivity type and a second drain zone of the second conductivity type continuous with the first drain zone subsequent to the step of forming the additional patterned layer.

19. A method as in claim 15 wherein the semiconductor material is silicon, characterized in that: the thermal oxidation is done at a temperature in the range of 800°–950° C.; and the providing step comprises performing a further thermal oxidation at a temperature in the range of 1050°–1150° C.

20. A method as in claim 15 wherein the semiconductor material is silicon, characterized in that the thermal oxidation is done at a temperature in the range of 800°–950° C.; and the providing step comprises:

performing a thermal oxidation to grow a lower sublayer of silicon dioxide along the second patterned layer and along the part of the remainder of the first patterned layer not covered by the second patterned layer;

depositing an intermediate sublayer of silicon nitride on the lower sublayer; and performing a thermal oxidation to grow an upper sublayer of silicon dioxide along the intermediate sublayer.

* * * * *